United States Patent [19]
Imaeda

[11] Patent Number: 6,025,644
[45] Date of Patent: Feb. 15, 2000

[54] LIQUID CRYSTAL DISPLAY AND APPARATUS USING THE SAME

[75] Inventor: Chiaki Imaeda, Nagano, Japan

[73] Assignee: Seiko Epson Corporation, Japan

[21] Appl. No.: 08/952,683

[22] PCT Filed: Mar. 26, 1997

[86] PCT No.: PCT/JP97/01033

§ 371 Date: Mar. 2, 1998

§ 102(e) Date: Mar. 2, 1998

[87] PCT Pub. No.: WO97/37275

PCT Pub. Date: Oct. 9, 1997

[30] Foreign Application Priority Data

Mar. 29, 1996 [JP] Japan ................................ 8-077655
Aug. 6, 1996 [JP] Japan ................................ 8-207403

[51] Int. Cl.[7] ............................ H01L 23/34; H01L 27/15; H01L 23/02
[52] U.S. Cl. ............................ 257/723; 257/678; 257/81; 257/99; 257/89
[58] Field of Search ................................ 257/723, 81, 99, 257/89, 678

[56] References Cited

FOREIGN PATENT DOCUMENTS

| 62-74222 | 5/1987 | Japan . |
|---|---|---|
| 63-155124 | 10/1988 | Japan . |
| 3-125383 | 12/1991 | Japan . |
| 4-40488 | 2/1992 | Japan . |
| 4-120937 | 10/1992 | Japan . |

Primary Examiner—Mahshid Saadat
Assistant Examiner—Jhihan B Clark
Attorney, Agent, or Firm—Harness, Dickey & Pierce, P.L.C.

[57] ABSTRACT

A high-reliability COG-type liquid crystal display device is produced with a high production yield without using a thermo-compression bonding process thereby preventing the connection of a liquid crystal driver IC from encountering a failure which would otherwise occur due to a high temperature in the thermo-compression bonding process. The liquid crystal display device comprises a pair of substrates (13, 14) facing each other via a liquid crystal, at least a liquid crystal driver IC (7) mounted on one substrate (13) by means of direct connection to the one substrate (13), and a plurality of semiconductor input terminals (21) formed on the substrate (13) so that signals are applied to the IC (7) via the semiconductor input terminals (21). The semiconductor input terminals (21) of the liquid crystal panel (8) are connected to semiconductor driving output terminals (6) of a portable telephone device or the like via an elastic connector (12). The elastic connector (12) includes a plurality of conductor elements and a plurality of electrically-insulating elements which are disposed alternately. The terminals located at opposite locations are electrically connected to each other via the conductor elements while adjacent terminals are electrically isolated from each other by the electrically-insulating elements.

11 Claims, 12 Drawing Sheets

LIQUID CRYSTAL DISPLAY AND APPARATUS USING THE SAME

TECHNICAL FIELD

The present invention relates to a liquid crystal display device for displaying visible information by controlling the orientation of a liquid crystal, and also to various apparatus using such a liquid crystal display device.

BACKGROUND ART

In recent years, a liquid crystal display device is used to display visible information in a wide variety of applications such as a navigation system, television, palm-top computer, electronic personal organizer, portable telephone, etc. In the production of liquid crystal display devices, one known technique to mount a semiconductor device such as a driver integrated circuit on a liquid crystal panel is to directly mount the semiconductor device on one of a pair substrates facing each other via a liquid crystal. This technique is called the COG (chip on glass) technique. It is expected that the COG technique will contribute to further reductions in the size and weight of liquid crystal display devices and also to an improvement in the connection pitch.

In conventional COG type liquid crystal display devices, a plurality of input connection terminals are formed on a substrate, and input bump electrodes of a liquid crystal driver IC are directly connected to the input connection terminals using a connection element such as an ACF (anisotropic conductive film). Furthermore, output connection terminals of an apparatus using a liquid crystal display, such as a portable telephone, are formed on an FPC (flexible printed circuit), and the FPC is connected to the input connection terminals. The connection between the FPC and the input connection terminals is generally made using an ACF.

In the conventional COG type liquid crystal display device, since the FPC is connected to the input connection terminals using the ACF, a thermo-compression bonding process is necessary to make the connection. However, the thermo-compression bonding process can cause a residual stress, which in turn causes the liquid crystal panel or the liquid crystal driver IC to receive a force arising from the residual stress. Heat generated during the thermo-compression bonding process can cause the ACF connecting the liquid crystal drive IC to the substrate to become soft, which in turn causes a trouble associated with the contact between the liquid crystal driver IC and the substrate. Although the problem associated with the connection of the liquid crystal driver IC may be avoided by performing the thermo-compression bonding process at a temperature lower than the softening temperature of the ACF connecting the liquid crystal driver IC to the liquid crystal panel, the reduction in the thermo-compression temperature can cause another problem associated with the reduction in the bonding strength.

DISCLOSURE OF INVENTION

In view of the problems in the conventional COG-type liquid crystal display device, it is an object of the present invention to provide a technique of producing a high-reliability liquid crystal display device with a high production yield without using a thermo-compression bonding process thereby preventing a liquid crystal driver IC from being destroyed and from being separated from a substrate. It is another object of the present invention to provide a technique of producing a liquid crystal display device or an apparatus using a liquid crystal display device by means of a simple assembling process.

To achieve the above objects, the invention provides a liquid crystal display device comprising: a pair of substrates facing each other via a liquid crystal; at least a semiconductor device directly connected to one substrate; and a plurality of semiconductor input terminals formed on the substrate so that signals may be applied to the semiconductor device via the semiconductor input terminals, the semiconductor input terminals being connected to semiconductor driving output terminals formed on an apparatus using the liquid crystal display device, wherein the semiconductor input terminals and the semiconductor driving output terminals are connected to each other via an elastic connector having a plurality of conductor elements and a plurality of electrically-insulating elements which are disposed alternately. Herein, the direct connection of the semiconductor device at least to one substrate is essential to the present invention. This means that the present invention is applied to a COG type liquid crystal display device.

In the liquid crystal display device constructed in the above-described manner and the apparatus using such a liquid crystal display device, the semiconductor input terminals are connected via the elastic connector to the semiconductor driving output terminals formed on the apparatus using the liquid crystal display device. Therefore, the connection can be made without having to perform a thermo-compression bonding process. As a result, it is possible to prevent troubles which would otherwise occur at the connections of a liquid crystal driver IC due to heat generated during the thermo-compression bonding process. Thus, it is possible to produce a high-reliability liquid crystal display device with a high production yield. Furthermore, the assembling process of the liquid crystal device and the apparatus using the liquid crystal display device can be performed very simply by placing the elastic connector at the predetermined location without needing the thermo-compression bonding process.

In the present invention, examples of the apparatus using a liquid crystal display device include a navigation system, a television receiver, a palm-top computer, an electronic personal organizer, and a portable telephone device. The pair of substrates between which the liquid crystal is disposed is generally made of transparent glass. Alternatively, the pair of substrates may also be made of a transparent synthetic resin or other materials as long as no problems occur in production. Examples of the semiconductor device include a driver IC for controlling the scanning electrodes and data electrodes of a simple matrix device, and a driver IC for controlling the scanning electrodes and data electrodes of an active matrix device. The semiconductor device may be connected to the substrate by means of any proper technique such as the ACF technique.

The semiconductor input terminals may be formed on the substrate into various patterns. For example, as represented by reference numeral 21 in FIG. 2, the semiconductor input terminals may be formed in a single particular area on the substrate. Alternatively, as represented by reference numerals 21a and 21b in FIG. 5, the semiconductor input terminals may be formed into separate groups located at both sides of the semiconductor device 7. When the semiconductor input terminals are formed in separate groups as in the case in FIG. 5, a plurality of connectors are disposed at locations corresponding to each terminal groups, as represented by reference numerals 32a and 32b in FIG. 5.

The semiconductor driving output terminals on the apparatus using the liquid crystal display device may be formed as an interconnection pattern on a PCB (printed circuit board) located in the apparatus using the liquid crystal display device. Alternatively, the semiconductor driving output terminals may also be formed as an interconnection pattern on an FPC (flexible printed circuit) extending from the apparatus using the liquid crystal display device.

The elastic connector may be made of an electrically-insulating elastic material. Herein, the elastic material refers to such a material which elastically deforms in response to a force exerted on it and produces a counterforce. Examples of the elastic material include silicone rubber and other kinds of rubber. The elastic connector includes a plurality of conductor elements extending from one side to the opposite side through the connector wherein the plurality of conductor elements are spaced at intervals of 30 to 50 µm. Adjacent conductor elements are separated by an electrically-insulating element. When the elastic connector is disposed between the semiconductor input terminals formed on the substrate of the liquid crystal panel and the semiconductor driving output terminals of the apparatus using the liquid crystal display device, the corresponding terminals are electrically connected to each other while adjacent terminals are electrically isolated from each other by the electrically-insulating element.

Because the elastic connector is made of an elastic material, it tends to deform, bend, or buckle. The deformation of the elastic connector can result in a problem with the electric connection. To avoid such a problem, it is desirable that there be provided connector guiding means for preventing the deformation of the elastic connector. The connector guiding means may be formed in various structures. For example, a hole with a size suitable for receiving the elastic connector may be employed as the connector guiding means.

Some liquid crystal display devices have a back light unit. The back light unit generally includes a light source for emitting light and a light guide for guiding the light emitted from the light source to the substrate constituting a liquid crystal panel. When such a back light unit is used, it is desirable that the back light unit have connector guiding means integrally formed in the light guide.

When the connector guiding means is realized by a hole, there is a possibility that the elastic connector inserted into the hole will move out of the hole due to some reason such as vibrations. To avoid such a problem, it is desirable to form a protrusion extending inward at a proper location in the hole so that the protrusion prevents the elastic connector from moving to the outside.

For example, as shown in FIG. 2, 8, or 9, the liquid crystal display device or the apparatus using a liquid crystal display device includes: a main board 4 connected to a control circuit 3 connected to an LSI or the like for controlling a semiconductor device used to control the liquid crystal; and a shielding case 11 or 68 disposed at the upper side of the liquid crystal display device. The shielding case 11 or 68 is made of metal or the like in such a manner that the displaying area of the liquid crystal display device is exposed through a window formed in the shielding case 11 or 68. The shielding case is disposed such that the upper side of the liquid crystal display device is covered with the shielding case.

In the case where the main board 4 is disposed at the back of the liquid crystal display device, the elastic connector is disposed between the main board and the substrate to which the semiconductor device is connected such that the liquid crystal display device, the main board, and the elastic connector itself are fixed at their own position by means of the elastic force of the elastic connector. More specifically, a pressure member 30 is disposed between the shielding case 11 and the liquid crystal display device so that the elastic connector is pressed by the shielding case via the pressure member 30 thereby ensuring that the tight contact between the semiconductor driving output terminals formed on the main board and the semiconductor input terminals formed on the substrate is maintained by the counterforce of the elastic connector which occurs as a result of the above pressure.

In the case where the plurality of semiconductor driving output terminals are formed on a connection circuit board for connecting the liquid crystal display device to the main board, and the liquid crystal display device is connected to the main board via the connection circuit board, the connection circuit board 65 is disposed between the elastic connector and the shielding case 68 such that the elastic connector is pressed by the shielding case and the substrate on which the semiconductor device is mounted thereby fixing the connection circuit board. In this case, a holding member 72 may be provided at the back of the liquid crystal display device so as to reinforce the mechanical strength of the entire structure including the shielding case. The liquid crystal display device may be placed in the shielding case in such a manner that the liquid crystal display device is supported between the shielding case and the holding member. The connection circuit board may be fixed in a more reliable fashion by the holding member and the shielding case, for example as shown in FIG. 10.

In this case, a guide 81 for positioning the connection circuit board and the elastic connector may be formed on the shielding case so that the elastic connector is positioned at its correct place. More specifically, the guide may be produced by bending small parts of the shielding case thereby forming lugs.

The connection circuit board 65 may be made of a flexible board such as an FPC so that relative positions of the main board and the liquid crystal display device may be determined in a more flexible fashion.

Furthermore, a slit may be formed in the shielding case in such a manner that the slit has a length smaller than the width of the connection part of an external connection board connected to the elastic connector and greater than the width of the other part of the external connection board so that the external circuit board may be placed through the slit thereby preventing the external circuit board from moving off the shielding case.

BEST MODE FOR CARRYING OUT THE INVENTION

First Embodiment

Figure 8:
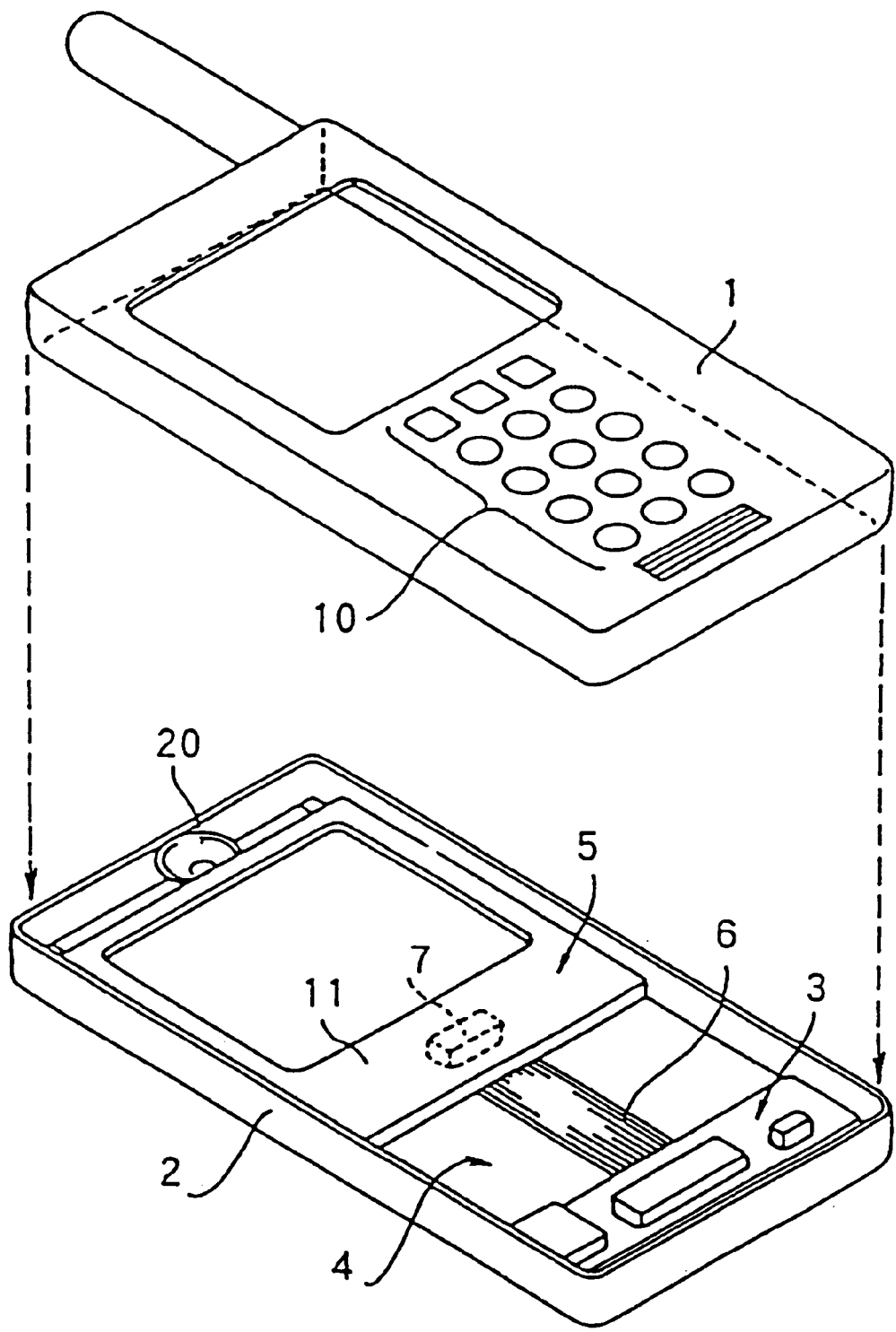
FIG. 8 is an exploded perspective view illustrating an embodiment of an apparatus using a liquid crystal display device, according to the present invention.

FIG. 8 illustrates a portable telephone device which is an embodiment of an apparatus using a liquid crystal display device according to the present invention. This portable telephone device includes an upper housing 1 and a lower housing 2. Inside the upper housing 1, there are provided components such as a PCB (printed circuit board) for controlling a keyboard 10. Inside the lower housing 2, there are provided components such as a circuit board 3 having a control LSI and other elements mounted thereon and a main board 4 on which the circuit board 3 is mounted. A liquid crystal display device 5 according to the present invention is mounted on the main board 4. An interconnection pattern serving as a plurality of semiconductor driving output terminals 6 are formed on the surface of the main board 4. The liquid crystal display device 5 includes, in its inside, a semiconductor device serving as a liquid crystal driver IC 7. After mounting the liquid crystal display device 5 on the main board 4, the liquid crystal driver IC 7 is electrically connected to the semiconductor driving output terminals 6. If the liquid crystal display device 5 and other required components are placed in the lower enclosure 2, and then the lower enclosure 2 is covered with the upper enclosure 1, a complete portable telephone device is obtained. In FIG. 8, reference numeral 20 denotes a loudspeaker.

Figure 1:
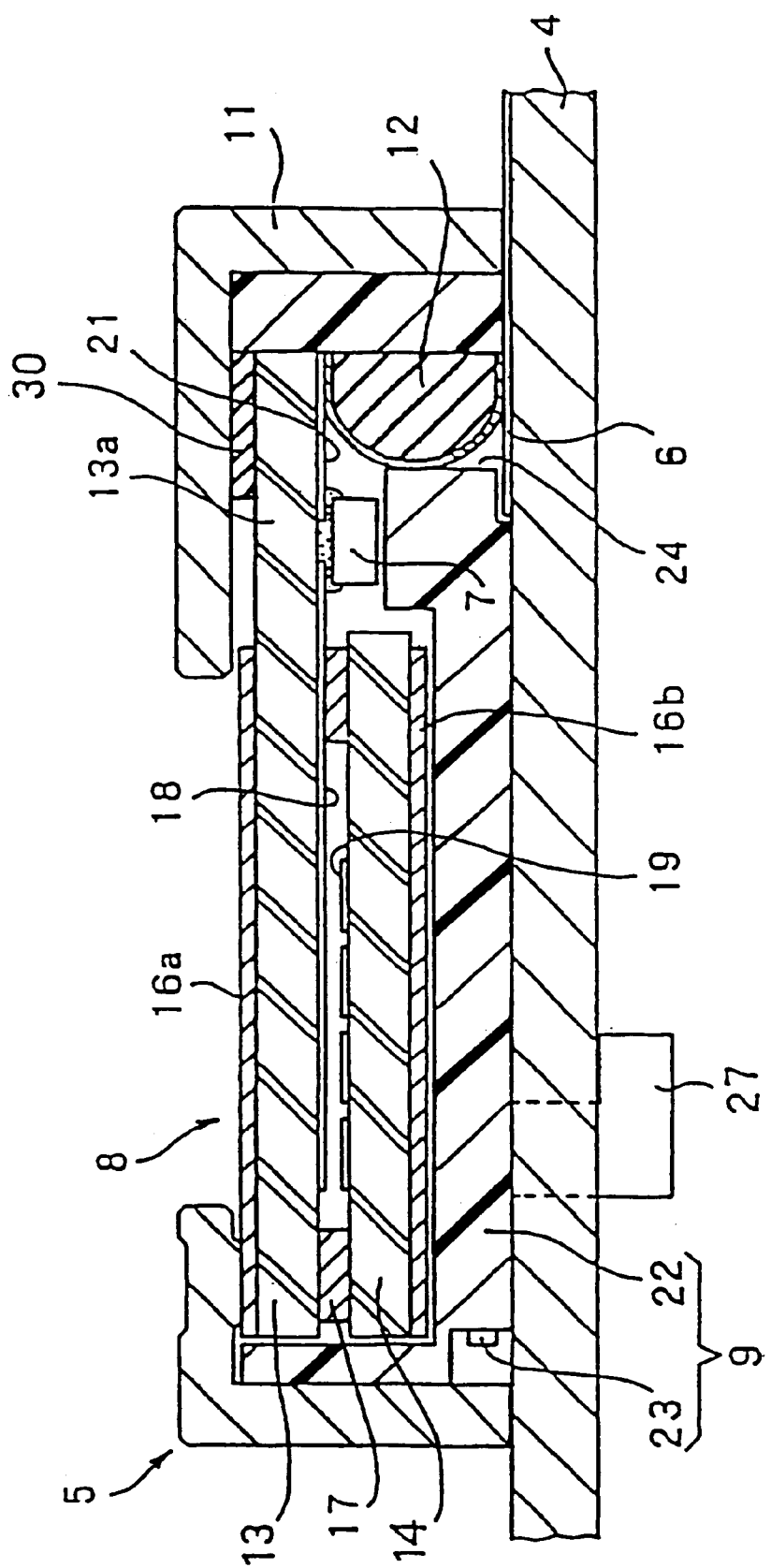
FIG. 1 is a cross-sectional side view illustrating an embodiment of a liquid crystal display device according to the present invention.
Figure 2:
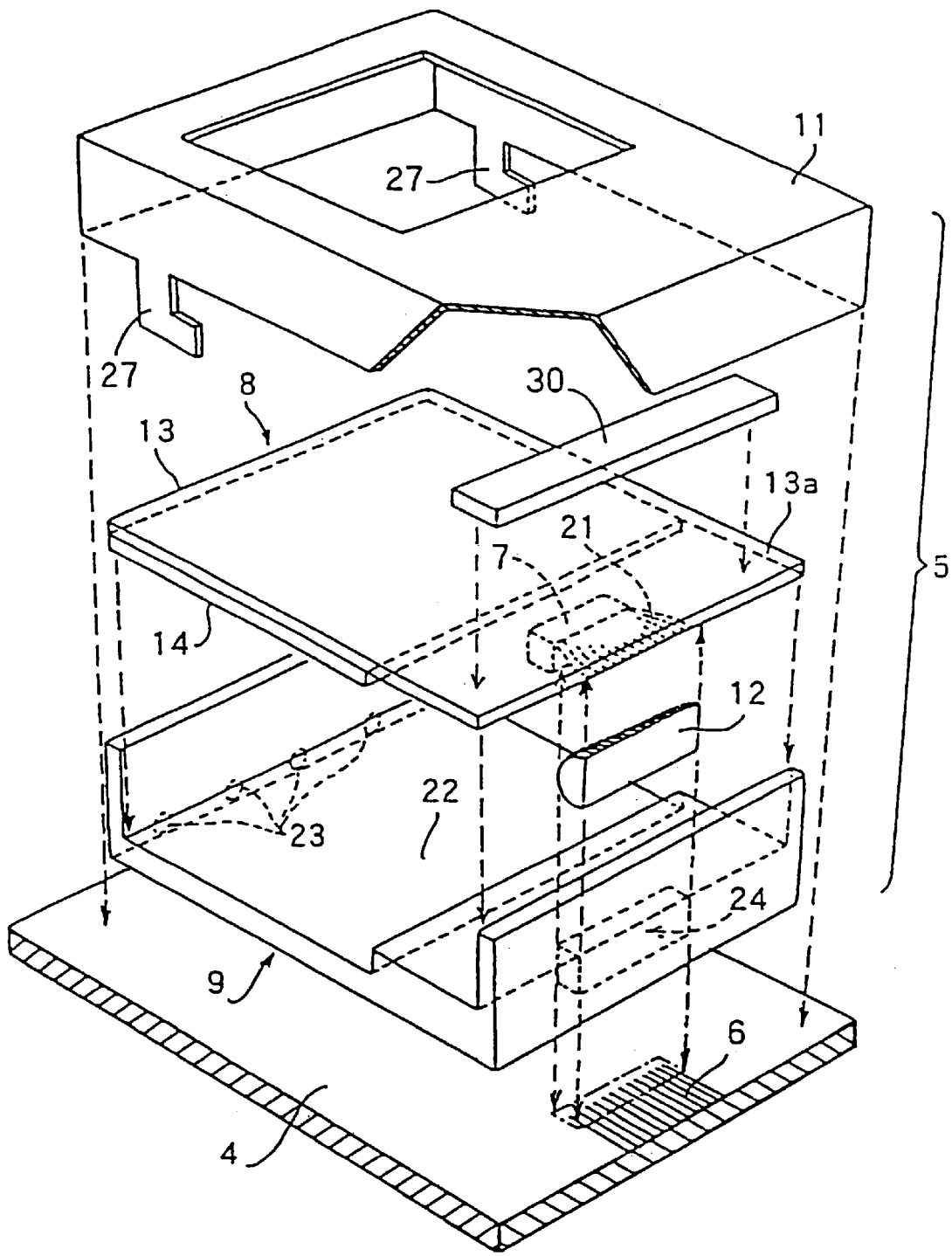
FIG. 2 is an exploded perspective view partially cutaway, illustrating the liquid crystal display device shown in FIG. 1.

As shown for example in FIG. 2, the liquid crystal display device 5 includes a liquid crystal panel 8, a back light unit 9, a shielding case 11, and an elastic connector 12. The liquid crystal panel 8, as shown in FIG. 1, includes a first substrate 13 made of transparent glass and a second substrate 14 also made of transparent glass. Transparent electrodes 18 are formed on the inner surface of the first substrate 13. On the other hand, transparent electrodes 19 are formed on the inner surface of the second substrate 14. These electrodes are made of a transparent conducting material such as ITO (indium thin oxide).

A polarizing plate 16a and polarizing plate 16b are bonded to the outer surfaces of the first substrate 13 and the second substrate 14, respectively. The first substrate 13 and the second substrate 14 are connected to each other via a predetermined gap called a cell gap, using a ring-shaped sealing element 17 so that a fluid-tight gap is created between the first and second substrates. A liquid crystal is sealed in the cell gap. Semiconductor input terminals 21 are formed on the inner surface of the first substrate 13, in a portion 13a extending outward (to right in FIG. 1) beyond the end of the second substrate 14. The semiconductor device or the liquid crystal driver IC 7 is connected directly on the first substrate 13 using an ACF (anisotropic conductive film) so that the output bump electrodes of the IC 7 are connected to the transparent electrodes 18 and the input bump electrodes of the IC 7 are connected to the semiconductor input terminals 21.

Referring again to FIG. 1, the back light unit 9 includes a light guide 22 and a plurality of, for example four LEDs (light emitting diodes) 23 fixed to the left end of the light guide 22. A rectangular-shaped guide hole 24 which also serves as connector guiding means is formed at the right end of the light guide 22, as also shown in FIG. 2. The guide hole 24 is formed to have a proper size so that it can accept the elastic connector 12 without producing a gap.

Figure 3:
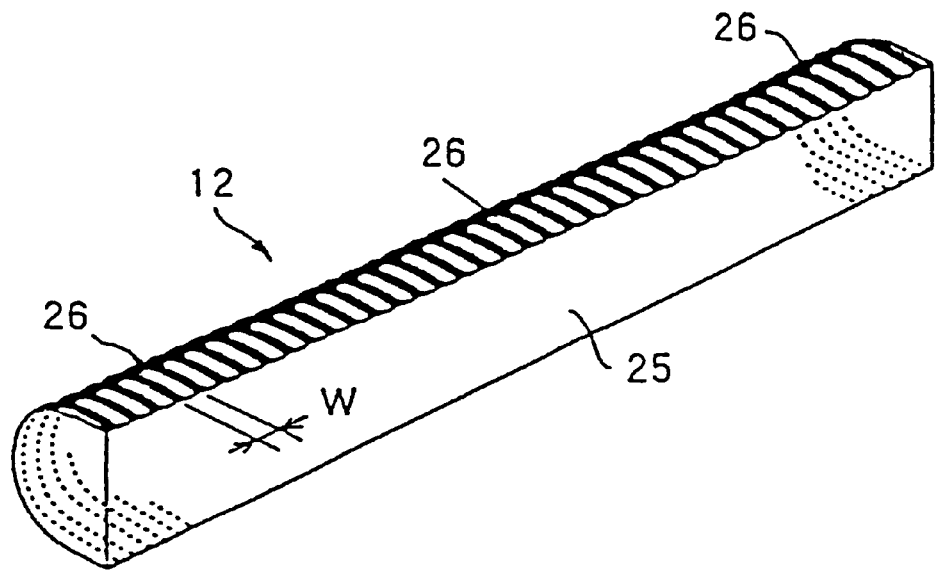
FIG. 3 is a perspective view illustrating an example of an elastic connector.

As shown in FIG. 3, the elastic connector 12 includes an elastic base 25 which is made into a semi-circular shape in cross section using an electrically-insulating elastic material such as silicone rubber, and also includes a large number of conductor elements 26 formed in parallel along the semi-circular perimeter of the elastic base 25. The conductor elements 26 are spaced by 15 $\mu$m to 25 $\mu$m and two adjacent conductor elements 26 are electrically isolated from each other by the electrically-insulating elastic material. In FIG. 3, symbol W denotes the center-to-center distance between adjacent conductor elements 26, usually called the conductor element pitch. W is generally set to a value in the range from 30 $\mu$m to 50 $\mu$m.

The liquid crystal display device of the present embodiment is mounted on the main board 4 of the portable telephone device (FIG. 8) as follows. That is, as shown in FIG. 2, the elastic connector 12 is inserted into the guide hole 24 of the light guide 22. The back light unit 9 is then placed at a predetermined location on the main board 4. The liquid crystal panel 8 is placed at a predetermined location on the back light unit 9. After placing a pressure member 30 made of an elastic material such as silicone rubber on the liquid crystal panel 8, the shielding case 11 is placed, via the pressure member 30, on the liquid crystal panel 8 which is located on the back light unit 9. Then, as shown in FIG. 1, a caulking stopper 27 is deformed so as to securely fix the main board to the shielding case 11. In this state, the elastic connector 12 is elastically compressed in the vertical direction in FIG. 1 by the pressure member 30. As a result, the conductor elements 26 (refer to FIG. 3) are pressed by the elastically restoring force of the elastic base 25 so that the conductor elements come into tight contact with both the semiconductor input terminals 21 on the liquid crystal panel 8 and the semiconductor driving output terminals 6 on the main board 4. To compress the elastic connector 12, instead of using a dedicated element such as the pressure member 30, a corresponding part of the shielding case 11 may be bent toward the inside so that a rib is formed at that location of the shielding case thereby compressing the elastic connector 12.

If the installation of the liquid crystal display device is completed, electric signals and electric power are supplied to the liquid crystal driver IC 7 from the control circuit board 3 (FIG. 8) via the elastic connector 12 (FIG. 1) and the semiconductor input terminals 21. In accordance with the received signals, the liquid crystal driver IC 7 controls the voltages applied to the electrodes 18 and 19 so that a visible image is displayed in an effective displaying area of the liquid crystal panel 8.

In the present embodiment, as described above, since the semiconductor input terminals 21 formed on the liquid crystal panel 8 are connected to the semiconductor driving output terminals 6 formed on the portable telephone device via the elastic connector 12, the thermo-compression bonding process required in the conventional technique is no longer required. Therefore, it is possible to prevent the liquid crystal driver IC 7 from receiving a force arising from a residual thermal stress and it is possible to prevent a connection failure between the IC 7 and the first substrate 13. Furthermore, the assembling process can be performed very simply by placing the elastic connector 12 at the predetermined location without needing the thermo-compression bonding process. Furthermore, since the elastic connector 12 is located in the guide hole 24, deformation such as bending or bucking occurs in the elastic connector 12 when the elastic connector 12 receives a force. This allows the electric connection between the semiconductor input terminals 21 and the semiconductor driving output terminals 6 to be maintained in a stable state.

Figure 4:
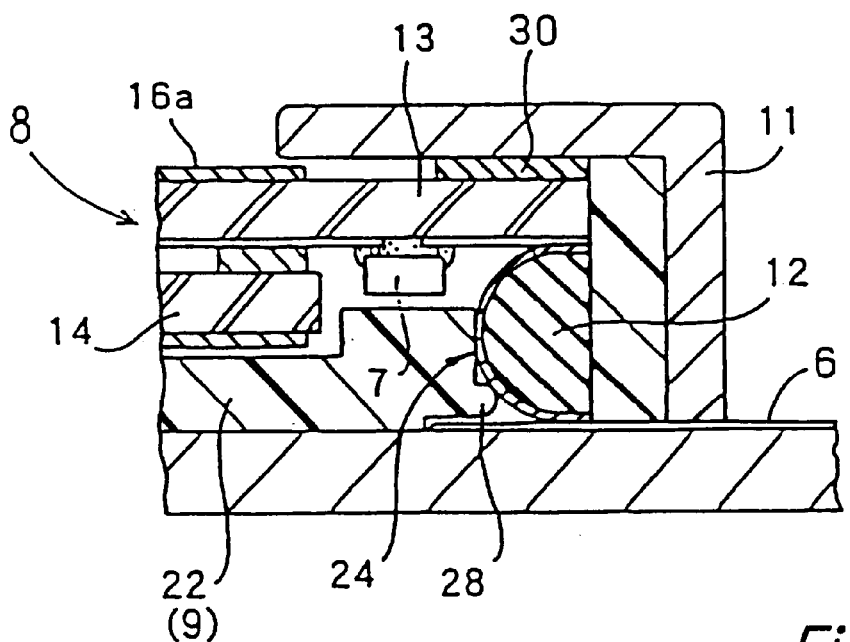
FIG. 4 is a cross-sectional view illustrating a modified example of connector guiding means.

A protrusion 28 may be formed at a proper location, for example at the lower end, of the guide hole 24 of the light guide 22 of the back light unit 9, as shown in FIG. 4. The protrusion 28 may be formed either over the entire lower end of the guide hole 24 or at a partial portion of the lower end. The protrusion 28 serves to prevent the elastic connector 12 inserted in the guide hole 24 from moving off. This allows the liquid crystal panel 8 to be easily handled.

Second Embodiment

Figure 5:
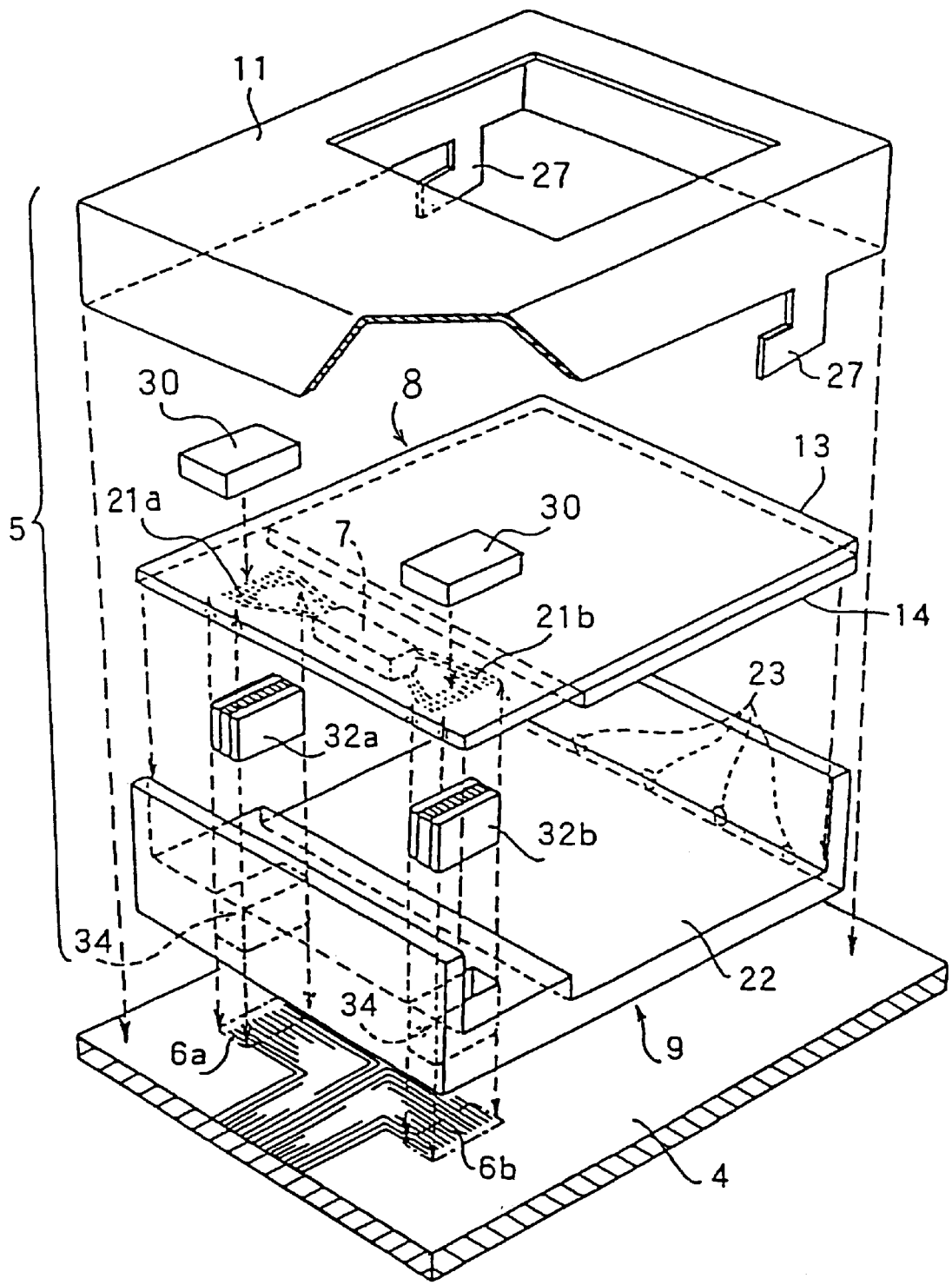
FIG. 5 is an exploded perspective view illustrating another embodiment of a liquid crystal display device according to the present invention.

FIG. 5 illustrates another embodiment of a liquid crystal display device according to the present invention. This embodiment differs in relation to the liquid crystal panel 8 from the first embodiment described above with reference to FIG. 2 in that two groups of semiconductor input terminals are provided, as represented by reference symbols 21a and 21b, at both sides of the liquid crystal driver IC 7, and there are provided two elastic connectors 32a and 32b and two pressure members 30 corresponding to the respective groups 21a and 21b, and furthermore there are provided two guide holes 34 corresponding to the respective elastic connectors 32a and 32b, in the light guide 22. Furthermore, there are provided two groups of semiconductor driving output terminals 6a and 6b on the main board 4 of the portable telephone device (FIG. 8) so that they correspond to the respective elastic connectors 32a and 32b.

Figure 6:
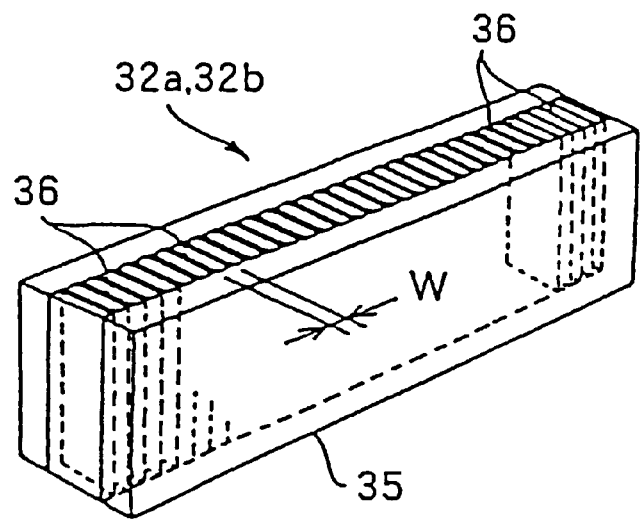
FIG. 6 is a perspective view illustrating another example of the elastic connector.

In the present embodiment, as shown in FIG. 6, the elastic connectors 32a and 32b each include an elastic base 35 formed into a generally rectangular shape using an electrically-insulating elastic material such as silicone rubber, and also include a great number of conductor elements 36 embedded in parallel in the elastic base 35. Both ends of each conductor element 36 are exposed to the outside of the elastic base 35. Adjacent conductor elements 36 are electrically isolated from each other by the electrically-insulating elastic material. The center-to-center distance between adjacent conductor elements or the pitch W is set to 30 μm to 50 μm. Also in this embodiment, no thermo-compression bonding process is required, and the assembling process of the liquid crystal display device becomes very simple and easy.

Figure 7:
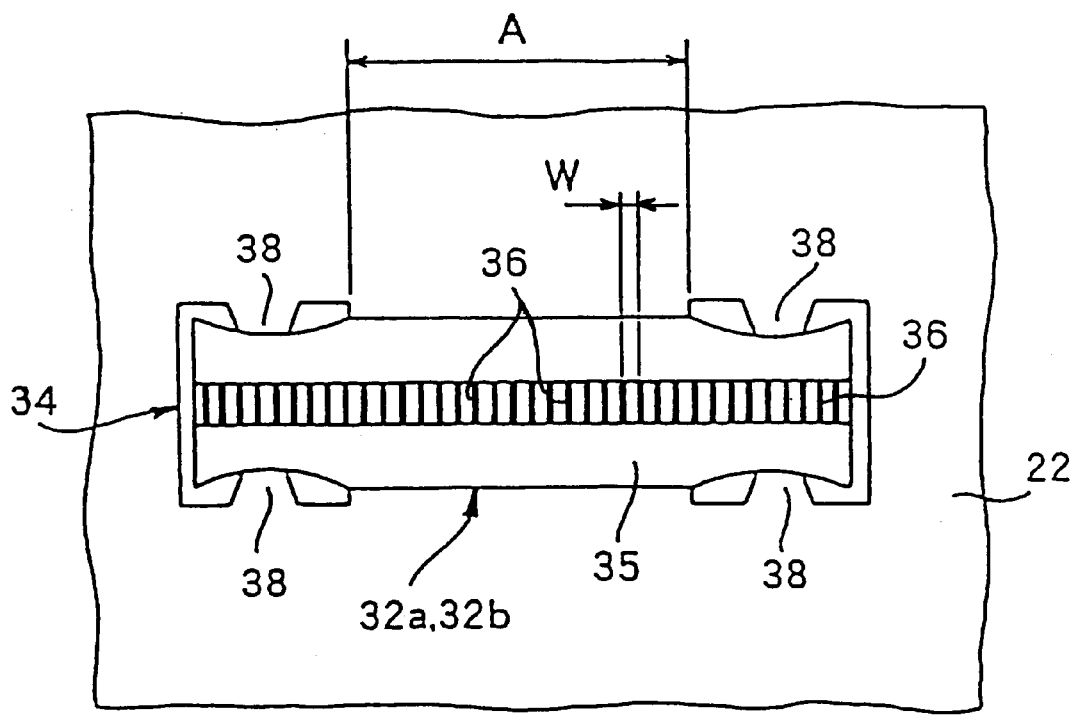
FIG. 7 is a plan view illustrating another modified example of connector guiding means.

As shown in FIG. 7, a pair of protrusions 38 are formed at each end of the guide hole 34 so that there are two pairs of protrusions 38 in total in each guide hole 34. These protrusions 38 prevent the elastic connectors 32a and 32b from moving off. Reference symbol A denotes the effective range in which the elastic connectors 32a and 32b can be practically used.

Modifications

The embodiments described above may be modified as follows. The liquid crystal display device according to the present invention may be used not only in a portable telephone device but also in a wide variety of apparatus such as a television receiver. The number of semiconductor devices mounted on the liquid crystal panel 8 is not limited to one. A plurality of semiconductor devices may also be mounted thereon. In this case, there may be provided a plurality of elastic connectors corresponding to the respective semiconductor devices. Instead of the shape shown in FIG. 3 or 6, the elastic connector may also be formed into an arbitrary desired shape.

Although in the embodiments described above with reference to FIGS. 2 and 5, the guide hole 24 or 34 serving as connector guiding means is formed in an integral fashion in the light guide 22 of the back light unit 9, the guide hole(s) 24 or 34 may also be formed separately from the back light unit 9. In some types of liquid crystal display devices, no back light unit is used. For such a type of liquid crystal display device, it is required that connector guide means be provided separately at another proper location.

Although in the embodiments described above with reference to FIGS. 2 and 5, the connector guiding means is realized by the guide hole(s) 24 or 34, the connector guiding means may also be formed into any desired structure as long as it can prevent the elastic connector from being deformed. For example, there may be provided vertically-extending pins around the elastic connector thereby preventing the deformation of the elastic connector.

Third Embodiment

Figure 9:
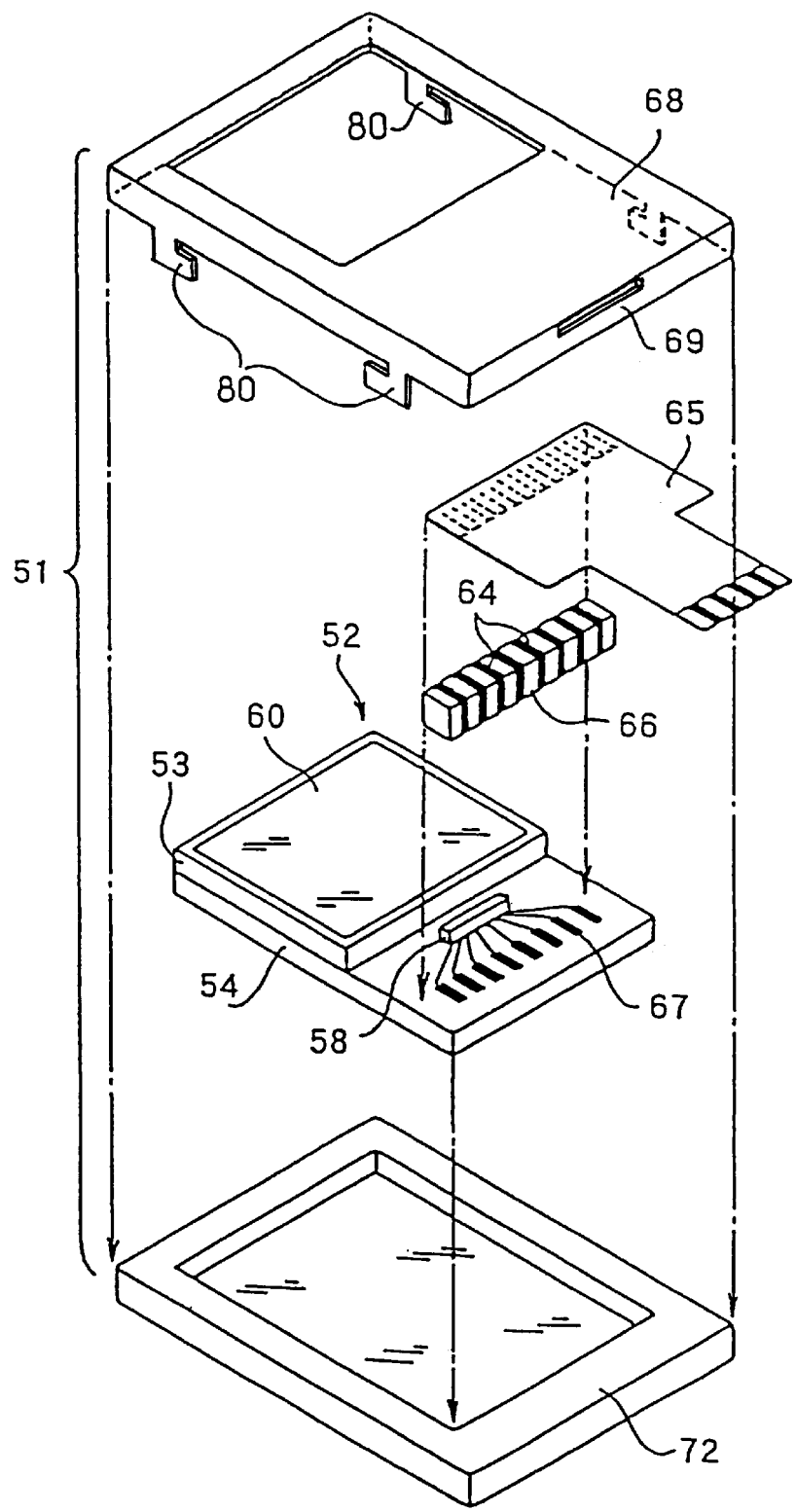
FIG. 9 is an exploded perspective view illustrating still another embodiment of a liquid crystal display device according to the present invention.
Figure 10:
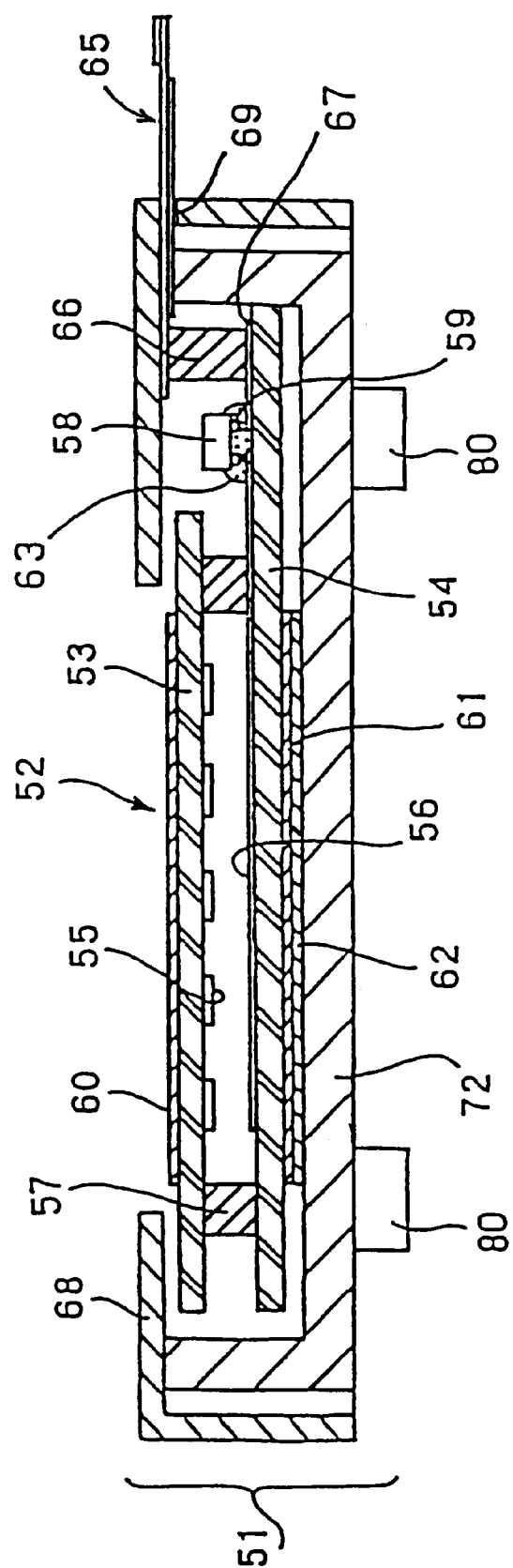
FIG. 10 is a cross-sectional side view of the embodiment shown in FIG. 9.
Figure 11:
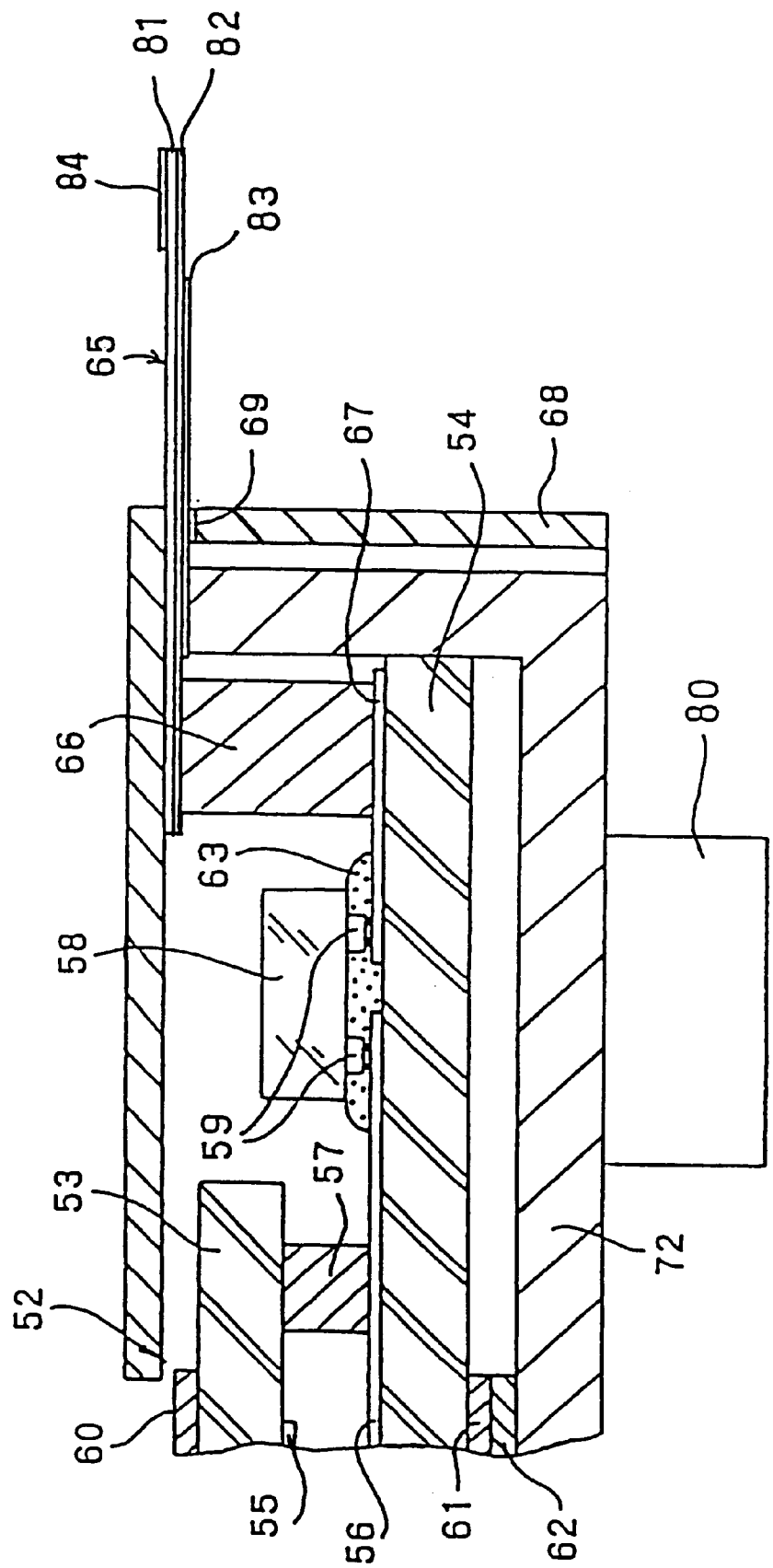
FIG. 11 is an enlarged cross-sectional side view illustrating a main part of the embodiment shown in FIG. 10.
Figure 12:
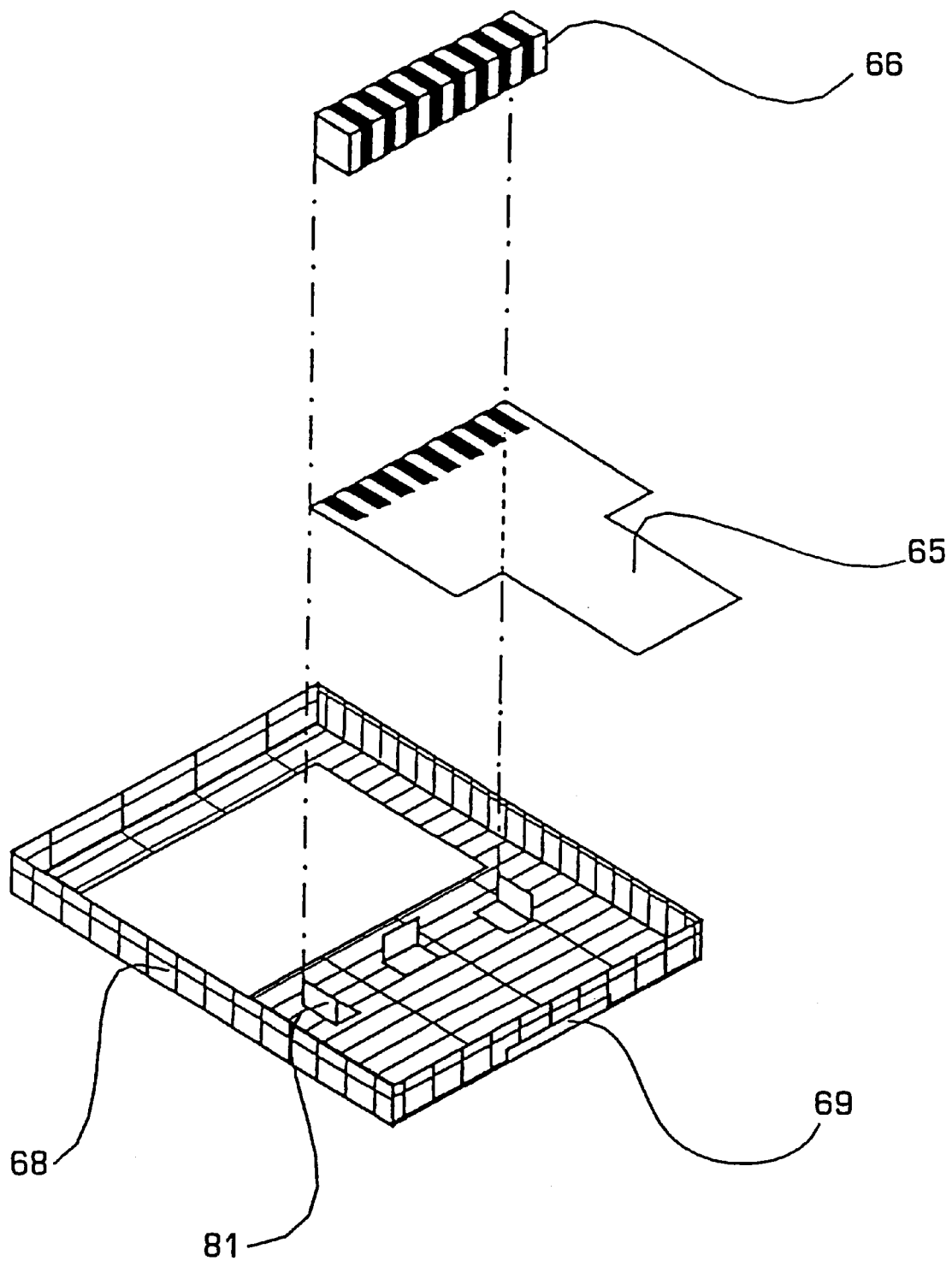
FIG. 12 is a schematic diagram illustrating a mechanism for positioning an FPC and an elastic connector.

FIGS. 9–12 illustrate a further embodiment of a liquid crystal display device according to the present invention, wherein FIG. 9 is an exploded perspective view of the liquid crystal display device, FIG. 10 is a cross-sectional view thereof, FIG. 11 is a cross-sectional view illustrating the detailed structure of its main part, and FIG. 12 illustrates a mechanism of positioning an FPC and an elastic connector. The present embodiment differs from the embodiments shown in FIGS. 2 and 5 in that the semiconductor driving output terminals on a device using the liquid crystal display device such as a portable telephone device are realized using an FPC (flexible printed circuit).

In FIGS. 9–12, the liquid crystal display device 51 includes a frame-shaped shielding case 68 made of a metal plate, a liquid crystal panel serving as displaying means 52, a liquid crystal driver LSI 58, an ACF (anisotropic conductive film) 63 for connecting the display means 52 to the bumps 59 formed on the active surface of the liquid crystal driver LSI 58 by means of the COG technique, and a holding member 72 for obtaining a high enough mechanical strength over the entire structure.

The displaying means 52 is produced as follows. In FIG. 10, a first substrate 53 made of soda-lime glass with a thickness of 0.7 mm and having a first transparent electrode layer 55 formed on its one surface is bonded to a second substrate 54 made of soda-lime glass with a thickness of 0.7 mm and having a second transparent electrode layer 56 formed on its one surface in such a manner that the first transparent electrode layer 55 and the second transparent electrode layer 56 face each other. A liquid crystal composition is then placed and sealed between the substrates 53 and 54. Then the liquid crystal driver LSI 58 is placed on one substrate 54 and electrically connected directly thereto using a COG ACF 63. Thus, a COG type displaying means 52 is obtained.

After that, the terminal part on the left end of an FPC (flexible printed circuit) 65 having semiconductor driving output terminals is electrically connected, using a rubber connector 66 serving as the elastic connector, to the semiconductor input terminals, that is, the external connection electrodes 67 formed on the COG type liquid crystal panel. At this stage, the displaying means 52 is placed between the shielding case 68 and the holding member 72, and the caulking stopper 80 is deformed so that the shielding case 68 and the holding member 72 are fixed to each other by the caulking. The FPC 65 is produced, for example as schematically shown in FIG. 11, by bonding a conductor 82 such as a copper foil to a base film 81 made of polyimide resin or the like and then forming polyimide resin serving as a cover layer 83 on the conductive layer, and finally bonding a reinforcing plate 84 to the terminal part which is inserted into a connector (not shown) thereby reinforcing the terminal part. As shown in FIG. 12, the shielding case 68 has lug-shaped guides 81 formed by bending small parts of the shielding case so that the FPC 65 and the rubber connector 66 are positioned by the lug-shaped guides 81.

The rubber connector 66, as shown in FIG. 9, includes a great number of conductor elements 64 which are disposed in parallel via an electrically-insulating element. A slit 68 is formed in the shielding case 68 so that the FPC 65 is inserted into the slit 69. To ease the process of installing the FPC 65, the slit 69 may be replaced by a cutout extending to the lower end of the case 68 so that the FPC 65 may be placed through the cutout. The rubber connector 66 may be made of an arbitrary material into any proper structure as long as its purpose is achieved. An example of the rubber connector 66 is a Shinetsu Inter Connector available from Shientsu Polymer Co.

In FIG. 10, reference numeral 60 denotes a first polarizing plate bonded to the surface of the first substrate 53, 61 denotes a second polarizing plate bonded to the surface of the second substrate 54, 57 denotes a sealing element for connecting the substrates 53 and 54 to each other, and 62 denotes a reflecting plate.

The structure described above allows the liquid crystal display device 51 to be produced by a simple production process without having to use a thermo-compression bonding process. Furthermore, since the FPC 65 is formed in a T-like shape, the FPC 65 is prevented from moving off the shielding case 68. The rubber connector 66 also serves as a supporting member for preventing the displaying means 52 from moving from a correct location in the enclosure. Furthermore, the rubber connector 66 diffuses the force exerted from the outside of the enclosure thereby preventing the display means 52 from being broken.

Figure 13:
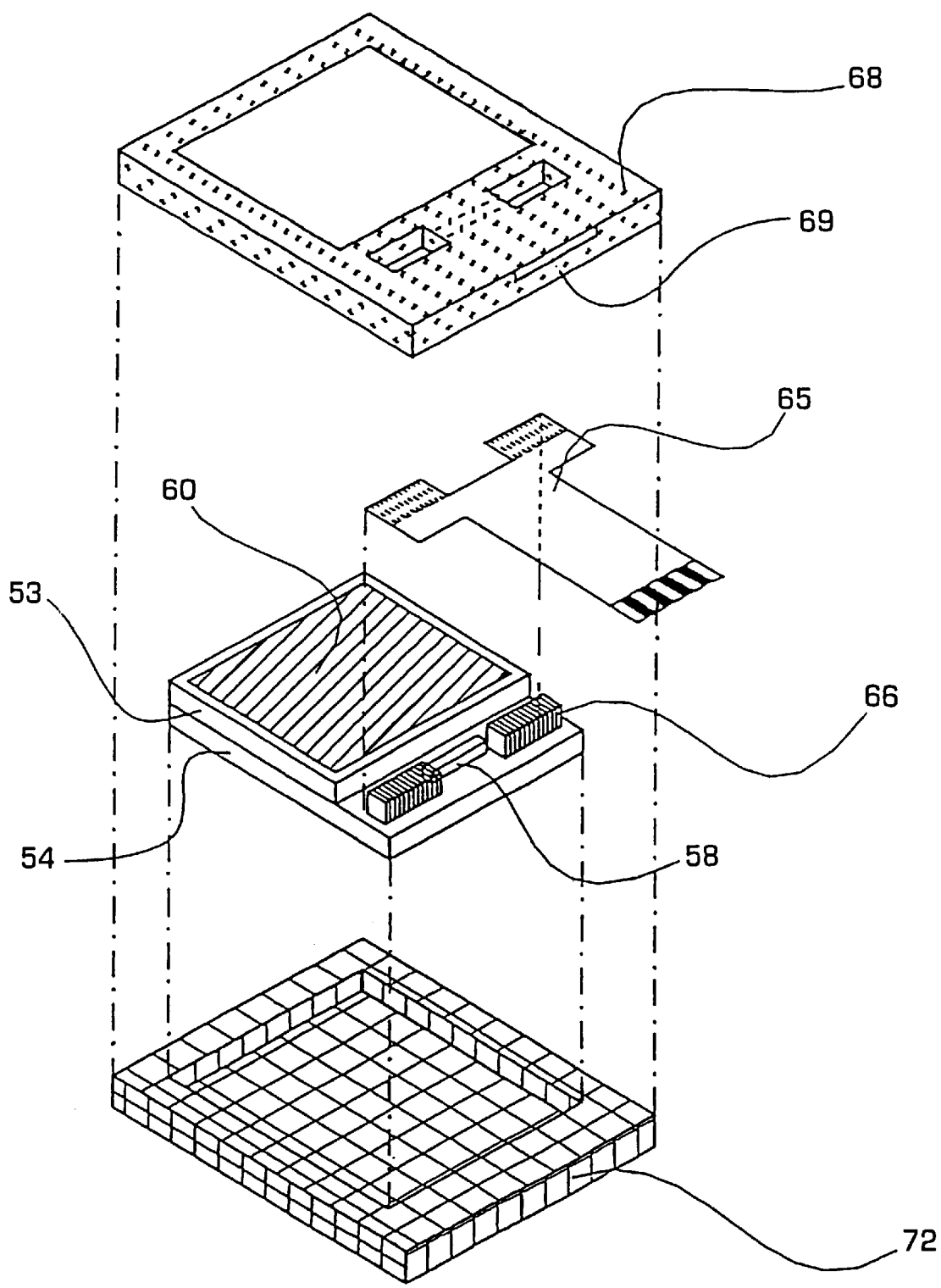
FIG. 13 is an exploded view illustrating a modification of the embodiment shown in FIG. 9.
Figure 14:
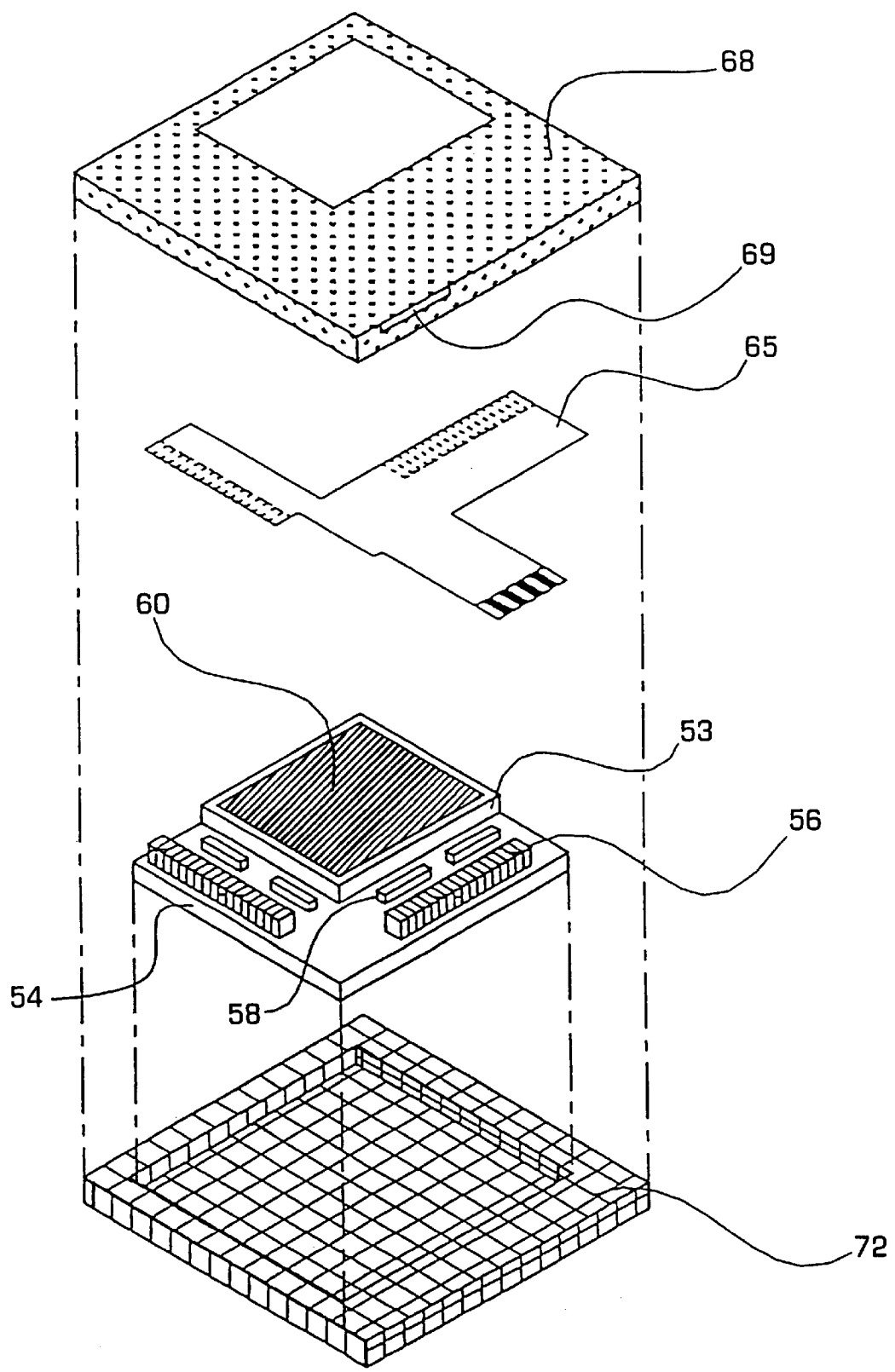
FIG. 14 is an exploded view illustrating another modification of the embodiment shown in FIG. 9.

FIGS. 13 and 14 illustrate modifications of the embodiment shown in FIG. 9. The differences of the embodiments shown in FIGS. 13 and 14 from the embodiment shown in FIG. 14 are described below. In the embodiment shown in FIG. 13, there are provided two elastic connectors located at both sides of the semiconductor device (the liquid crystal driver LSI 58). The elastic connectors and the connection parts of the FPC 65 which are connected to the elastic connectors are disposed at locations corresponding to the respective input terminal groups. On the other hand, in the embodiment shown in FIG. 14, semiconductor devices are disposed along two adjacent sides of the second substrate 54, and elastic connectors and an FPC are disposed at locations corresponding to the semiconductor input terminals of the semiconductor devices. In the embodiment shown in FIG. 14, there is also provided a bus line on the FPC 65 so that signals are transmitted among the semiconductor devices (liquid crystal driver LSIs) via the bus line.

In FIGS. 13 and 14, the liquid crystal display device 51 includes a frame-shaped shielding case 68 made of a metal plate, a liquid crystal panel serving as displaying means 52, a liquid crystal driver LSI 58, an ACF (anisotropic conductive film) 63 for connecting the display means 52 to the bumps 59 formed on the active surface of the liquid crystal driver LSI 58 by means of the COG technique, and a holding member 72 for obtaining a high enough mechanical strength over the entire structure.

Although the present invention has been described above with reference to specific embodiments, the present invention is not limited to these embodiments. It should be understood that various changes, substitutions and alterations can be made herein without departing from the spirit and scope of the invention as defined by the appended claims.

As described above, the liquid crystal display device of the present invention and apparatus using a liquid crystal display device according to the present invention have the following advantages. Terminals are connected to each other without having to use a thermo-compression bonding process. As a result, it is possible to prevent troubles which would otherwise occur at the connections between a semiconductor device and a substrate due to heat generated during the thermo-compression bonding process. Thus, it is possible to produce a high-reliability liquid crystal display device with a high production yield. Furthermore, the assembling process of the liquid crystal device can be performed very simply by placing the elastic connector at the predetermined location without needing the thermo-compression bonding process.

Instead of forming a great number of semiconductor input terminals in a single large area, the semiconductor input terminals may be divided into a small number of groups at different locations. This allows the space around the semiconductor device to be used in an efficient manner, and thus the liquid crystal display device can be produced in a small-sized form.

Furthermore, it is possible to prevent the elastic connector from being deformed. This allows the terminals to be connected in a good state for a long time.

The connector guiding means can be easily produced.

Once the elastic connector is placed in the connector guiding means, the elastic connector is prevented from moving outward. In this construction, furthermore, the elastic connector is prevented from being separated from the connector guiding means or the back light unit, and therefore it is possible to handle these elements as a single unit. This makes it easier to handle and control the components.

I claim:

1. A liquid crystal display device comprising: a pair of substrates facing each other via a liquid crystal; a semiconductor device directly connected at least to one substrate; and a plurality of semiconductor input terminals formed on the substrate so that signals may be applied to the semiconductor input terminals, a light source for emitting light, a light guide for guiding the light emitted from said light source, and a hole formed in said light guide for receiving an elastic connector;

said semiconductor input terminals being connected to semiconductor driving output terminals formed on an apparatus using the liquid crystal display device, wherein said semiconductor input terminals and said semiconductor driving output terminals are connected to each other via said elastic connector having a plurality of conductor elements and a plurality of electrically-insulating elements which are disposed alternately.

2. A liquid crystal display device according to claim 1, wherein said plurality of semiconductor input terminals are divided into a plurality of groups located at both sides of the semiconductor device, and a plurality of elastic connectors are disposed at locations corresponding to said groups.

3. A liquid crystal display device according to claim 1, wherein a protrusion extending toward said elastic connector located in said hole is formed in said hole.

4. An apparatus using a liquid crystal display device, said apparatus including a plurality of semiconductor driving output terminals to which said liquid crystal display device is connected, said liquid crystal display device comprising: a pair of substrates facing each other via a liquid crystal; a semiconductor device directly connected at least to one substrate; and a plurality of semiconductor input terminals formed on the substrate so that signals may be applied to the semiconductor device via said semiconductor input terminals, a shielding case located at the front of said liquid crystal display device, and a pressure member located between said shielding case and said liquid crystal display device, wherein said semiconductor input terminals and said semiconductor driving output terminals are connected to each other via an elastic connector having a plurality of conductor elements and a plurality of electrically-insulating elements which are disposed alternately;

wherein said plurality of semiconductor driving output terminals are formed on a main board disposed at the back of said liquid crystal display device and said plurality of semiconductor driving output terminals are connected to a control circuit for controlling said semiconductor device; and said elastic connector is supported between said main board and said substrate on which the semiconductor device is connected; and wherein said elastic connector is fixed by pressing via said pressure member thereby connecting said semiconductor input terminals to said semiconductor output terminals.

5. A liquid crystal display device comprising:

a pair of substrates facing each other via a liquid crystal;

a semiconductor device directly connected to at least one of said pair of substrates;

a plurality of semiconductor input terminals formed on said at least one substrate so that signals may be applied to said semiconductor device;

an elastic connector including a plurality of conductor elements and a plurality of electrically-insulating elements which are alternately disposed for coupling with semiconductor driving output terminals formed on an apparatus using said liquid crystal display device;

a light source for emitting light; and a light guide for guiding the light emitted from said light source and said light guide having a hole for receiving said elastic connector.

6. An apparatus comprising:

a plurality of semiconductor driving output terminals;

a liquid crystal display device including a plurality of semiconductor input terminals for applying signals to a semiconductor device connected thereto, said plurality of semiconductor input terminals being connected to said plurality of semiconductor driving output terminals by an elastic connector having a plurality of conductor elements and a plurality of electrically-insulating elements which are disposed alternately; and a shielding case located at the front of said liquid crystal display device and a pressure member located between said shielding case and said liquid crystal display device;

wherein said elastic connector is fixed by pressing via said pressure member thereby connecting said semiconductor input terminals to said semiconductor output terminals.

7. An apparatus using a liquid crystal display device, said apparatus including a plurality of semiconductor driving output terminals to which said liquid crystal display device is connected, said liquid crystal display device comprising:

a pair of substrates facing each other via a liquid crystal;

a semiconductor device directly connected at least to one substrate;

a plurality of semiconductor input terminals formed on the substrate so that signals may be applied to the semiconductor device via said semiconductor input terminals, said semiconductor input terminals and said semiconductor driving output terminals being connected to each other via an elastic connector having a plurality of conductor elements and a plurality of electrically-insulating elements which are disposed alternately; and a shielding case located at a front of said liquid crystal display device;

wherein said plurality of semiconductor driving output terminals are formed on a connection circuit board for connecting said semiconductor device to a main board to which a control circuit for controlling said semiconductor device is connected; and said connection circuit board is located between said elastic connector and said shielding case, and said elastic connector is pressed by said shielding case and said substrate to which said semiconductor device is connected, thereby fixing said connection circuit board.

8. An apparatus using a liquid crystal display device according to claim 7, wherein said shielding case has a guide for positioning said connection circuit board and said elastic connector.

9. An apparatus using a liquid crystal display device according to claim 7, wherein said connection circuit board further comprises a flexible board.

10. A liquid crystal display device comprising:

a pair of substrates facing each other via a liquid crystal;

a semiconductor device directly connected at least to one substrate; and a plurality of semiconductor input terminals formed on the substrate so that signals may be applied to the semiconductor input terminals, said semiconductor input terminals being connected to semiconductor driving output terminals formed on an apparatus using the liquid crystal display device;

wherein said semiconductor input terminals and said semiconductor driving output terminals are connected to each other via an elastic connector having a plurality of conductor elements and a plurality of electrically-insulating elements which are disposed alternately, said elastic connector having a semi-circular cross-sectional shape.

11. An apparatus using a liquid crystal display device, said apparatus including a plurality of semiconductor driving output terminals to which said liquid crystal display device is connected, said liquid crystal display device comprising:

a pair of substrates facing each other via a liquid crystal;

a semiconductor device directly connected at least to one substrate;

a plurality of semiconductor input terminals formed on the substrate so that signals may be applied to the semiconductor input terminals;

a light source for emitting light;

a light guide for guiding the light emitted from said light source; and a hole formed in said light guide for receiving an elastic connector;

wherein said semiconductor input terminals and said semiconductor driving output terminals are connected to each other via said elastic connector having a plurality of conductor elements and a plurality of electrically-insulating elements which are disposed alternately, said elastic connector having a semicircular cross-sectional shape.

* * * * *